United States Patent
Menon et al.

(10) Patent No.: US 7,911,873 B1
(45) Date of Patent: Mar. 22, 2011

(54) DIGITAL DELAY LOCKED LOOP IMPLEMENTATION FOR PRECISE CONTROL OF TIMING SIGNALS

(75) Inventors: Raghavan Menon, Saratoga, CA (US); Raj Mahajan, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 170 days.

(21) Appl. No.: 12/346,854

(22) Filed: Dec. 31, 2008

Related U.S. Application Data

(60) Provisional application No. 61/018,352, filed on Dec. 31, 2007.

(51) Int. Cl.
*G11C 8/00* (2006.01)
(52) U.S. Cl. .......... 365/233.13; 365/194; 365/233.1
(58) Field of Classification Search .......... 365/194, 365/233.1, 233.13
See application file for complete search history.

(56) References Cited

U.S. PATENT DOCUMENTS

| | | | |
|---|---|---|---|
| 6,492,852 B2 | 12/2002 | Fiscus et al. | |
| 6,919,749 B2 | 7/2005 | Alon et al. | |
| 6,987,408 B2 | 1/2006 | Kim et al. | |
| 7,161,397 B2 | 1/2007 | Lee et al. | |
| 7,274,236 B2 | 9/2007 | Lee et al. | |
| 2008/0088349 A1* | 4/2008 | Lee | 327/158 |
| 2008/0297214 A1* | 12/2008 | Easwaran | 327/157 |

* cited by examiner

*Primary Examiner* — Hoai V Ho
(74) *Attorney, Agent, or Firm* — Kanika Radhakrishnan; Evergreen Valley Law Group, P.C.

(57) ABSTRACT

An efficient implementation of a digital delay locked loop (DLL) circuit is disclosed. The delay locked loop (DLL) circuit includes a phase detector circuit, a clock divider circuit, a delay, a delay control finite state machine (FSM) and an output low pass filter. The delay includes a coarse delay line and a fine delay line. The coarse delay line delays a signal by a fixed large amount and the fine delay line introduces a smaller precise delay. The delay control FSM adjusts the delay to keep the output signal of the DLL synchronized with the input. The adjustment is averaged over a range of cycle periods in order to avoid adjusting the edges of signal waveform constantly. The low pass filter at the output minimizes the jitter in the output signal.

18 Claims, 7 Drawing Sheets

DIGITAL DELAY LOCKED LOOP IMPLEMENTATION FOR PRECISE CONTROL OF TIMING SIGNALS

CROSS REFERENCE TO RELATED APPLICATIONS

This patent application claims priority from provisional patent application No. "61/018,352" titled "DELAY LOCKED LOOP IMPLEMENTATION", filed on Dec. 31, 2007 in the United States Patent and Trademark Office.

FIELD OF THE INVENTION

Embodiments of the present disclosure relate generally to the field of memory interfaces and in particular to precise timing control using digital delay locked loops.

BACKGROUND

Often, in computer systems, a single data rate transfer technique is used to transfer data between a memory and a data processing chip by using a clock cycle. The data transfer is supported with the help of a control over some signals. Data between the data processing chip and the memory chip changes on a single edge in the single data rate devices.

In the existing techniques the computer systems use a double data rate to transfer the data between memory and the data processing chip. Double data rate allows twice the data to be transferred on each clock cycle as compared to the single data rate transfer technique and the data between the data processing chip and the memory chip changes on both edges of a reference clock signal. As an example there exists a method wherein, a Delay Locked Loop uses a timing signal. An example of the timing signal is a control signal to the memory chip that can be synchronized with respect to an internal reference signal. This is accomplished by delaying a desired signal by a particular amount and then comparing the delayed signal to the reference signal. The delay can be adjusted until the reference signal and the delayed signal have a desired timing relationship. The existing technique may not support to achieve a fine delay resolution. Also, more gates are used for delaying the desired signal.

In another example, the Delay Locked Loop in double data rate memory interfaces use analog circuit to delay or compare signals. The analog circuits are difficult to implement and control using standard digital logic processes as the analog circuits require additional characterization and prototype work.

In light of the foregoing discussion, it is desirable to have an efficient system and method for precise control of timing signals between the memory and the processing chip in Digital Delay Locked Loop.

SUMMARY

In accordance with an embodiment of the present disclosure, a digital delay locked loop is disclosed. A delay locked loop (DLL) circuit includes a clock divider circuit for dividing an input clock signal into one or more clock signals and a phase detector circuit for comparing the phases of a reference clock signal and a delay line output signal. The DLL also includes a delay circuit to synchronise the reference clock signal and a delay line output signal, wherein the delay circuit comprises a coarse delay line and a fine delay line. The coarse delay line introduces coarse grain adjustments for delaying a signal by a fixed and relatively large amount. The fine delay line introduces fine grained adjustments for inserting a smaller and more precise delay. The DLL further includes a delay control finite state machine for controlling the delay circuit and a low pass filter at the output.

In accordance with an embodiment of the present disclosure, a method for generating a delay in a delay locked loop (DLL) circuit is provided. The method includes generating a reference clock. The method also includes receiving the reference clock signal and a delay line output signal for generating an error signal. The method further includes receiving the error signal for generating coarse and fine control signals. Furthermore, the method includes receiving the control signals for generating the delay line output signals. The method also includes receiving the reference clock signal and the control signals for providing a delayed clock signal

DETAILED DESCRIPTION OF THE EMBODIMENTS

Figure 1:
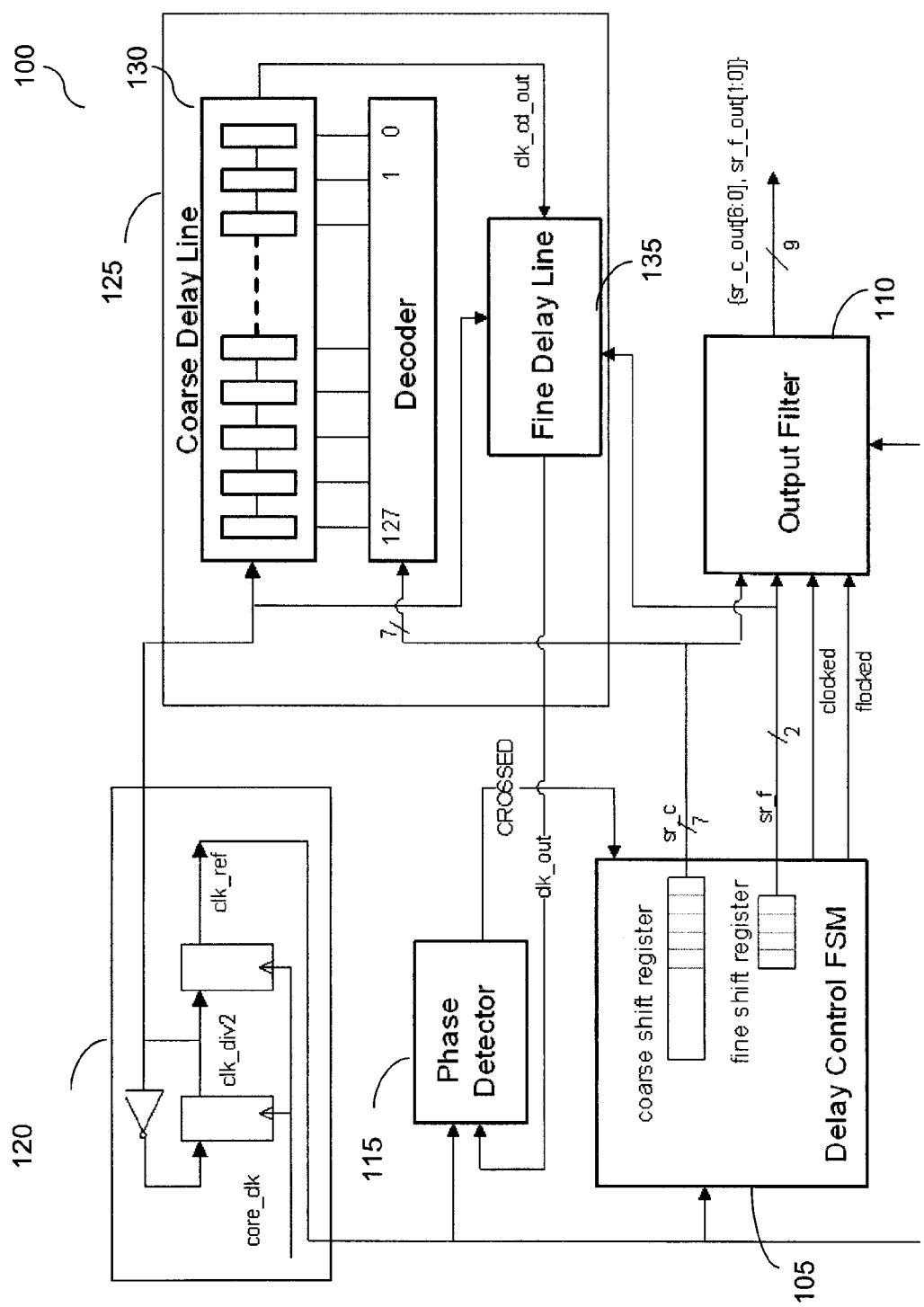
FIG. 1 is a block diagram of a delay locked loop in accordance with an embodiment of the invention.

FIG. 1 is a block diagram of a delay locked loop 100 in accordance with an embodiment of the invention.

The Delay locked loop 100 includes a delay control finite state machine (FSM) 105, an output filter 110, a phase detector 115, a clock divider 120, and a delay line 125.

In an embodiment of the invention, delay locked loop 100 is a digital delay locked loop.

In an embodiment of the invention, delay locked loop 100 is used to adjust timing signals between a memory chip, for example, double data rate (DDR) memory chip and a memory controller, for example DDR memory controller.

The delay control FSM 105 applies a minimum delay and checks the phase detector 115 to determine if an edge is detected. The delay control FSM 105 then sets the delay line to use another coarse delay element and checks the phase detector 115 to determine if the edge is detected. This is repeated until the phase detector 115 detects a new value. If the new value is detected in the phase detector 115 then, a programmed number of coarse delay elements are reduced by one. Further, fine delay is set to one for the fine delay element. Another fine delay element is added if the edge is not detected. If the edge is detected then, the final values of coarse delay and the fine delay are produced as output. The entire process repeats indefinitely.

The delay control FSM 105 receives a reference clock from clock divider 120, shift data from user logic to configure the coarse shift register and the fine shift register, and a crossed signal from phase detector 115 to indicate when the output clock edge has passed the reference clock edge. The coarse shift register holds the bits to determine the amount of the delay for a coarse delay line and the fine shift register holds the bits to determine the amount of the delay for a fine delay line. The outputs from delay control FSM 105 are the control bits for the coarse delay line. The fine delay line and control signals (C-locked and F-locked) to output filter 110 for use in jitter mitigation. The C-locked and F-locked control signals indicate a complex measurement; thereby the indicators enable a transfer of one more codes to the output filter 110. In an embodiment of the invention, delay control FSM 105 implements an algorithm to automatically adjust the delays as required to synchronize the output clock with the desired position with respect to the input clock.

The output filter 110 comprises of a digital logic to implement an exponentially decaying average values. Observations are made on the C-locked and F-locked control signals. In an embodiment, a previous value of the coarse delay and the fine delay in an average is multiplied by $15/16$. A new value of coarse delay and fine delay is multiplied by $1/16$. The previous value and the new value are added to generate a new output average value.

The output filter 110 receives the reference clock, the C-locked and F-locked control signals as well as the delay control bits for the coarse and fine delay lines from delay control FSM 105. Output filter 110 filters out variations in individual measurements of coarse and fine delay that result from jitter on the input clock.

The phase detector 115 receives the reference clock (clk_ref) from clock divider 120 and the output clock (clk_out) from fine delay line 125. The phase detector 115, in one embodiment is a flip flop that uses one of its inputs to sample the other input. It compares an undelayed clock signal and a delayed clock signal. It continues to compare till it detects one clock cycle change. It produces a control signal (crossed), to indicate when an edge of the output clock has passed the edge of the reference clock. This information is used by delay control FSM 105 to adjust the delay components of delay line 125 to achieve the precise timing relationship required.

The clock divider 120 receives the users input clock (core_clk) and produces two reference clocks (clk_ref and clk_div2) that are reduced in frequency by 2. The reference clock clk_ref is delayed by one clock cycle. This action creates stable and precise reference clocks for use as the starting time base in digital delay locked loop and the other main function blocks in digital delay locked loop.

The delay line 125 has two main components the coarse delay line 130 and the fine delay line 135. The coarse delay Line 130 delays the clk_div2 clock from clock divider 120 by relatively large delay amounts as instructed by the sr_c signals from delay control FSM 105. The coarse delay line 130 is designed such that it minimizes the rise and fall mismatches and asymmetry. The delayed output (clk_cd_out) is received by the fine delay line 135 and is further delayed by a relatively small amount as indicated by the sr_f signals from delay control FSM 105. The fine delay line 135 interpolates between a single delay value from the coarse delay line 130. The final delayed clock (clk_out) is provided to phase detector 115 to determine the relationship with respect to the reference clock.

The delay locked loop 100 described above may include a greater or a fewer number of elements than those included in FIG. 1.

Figure 2:
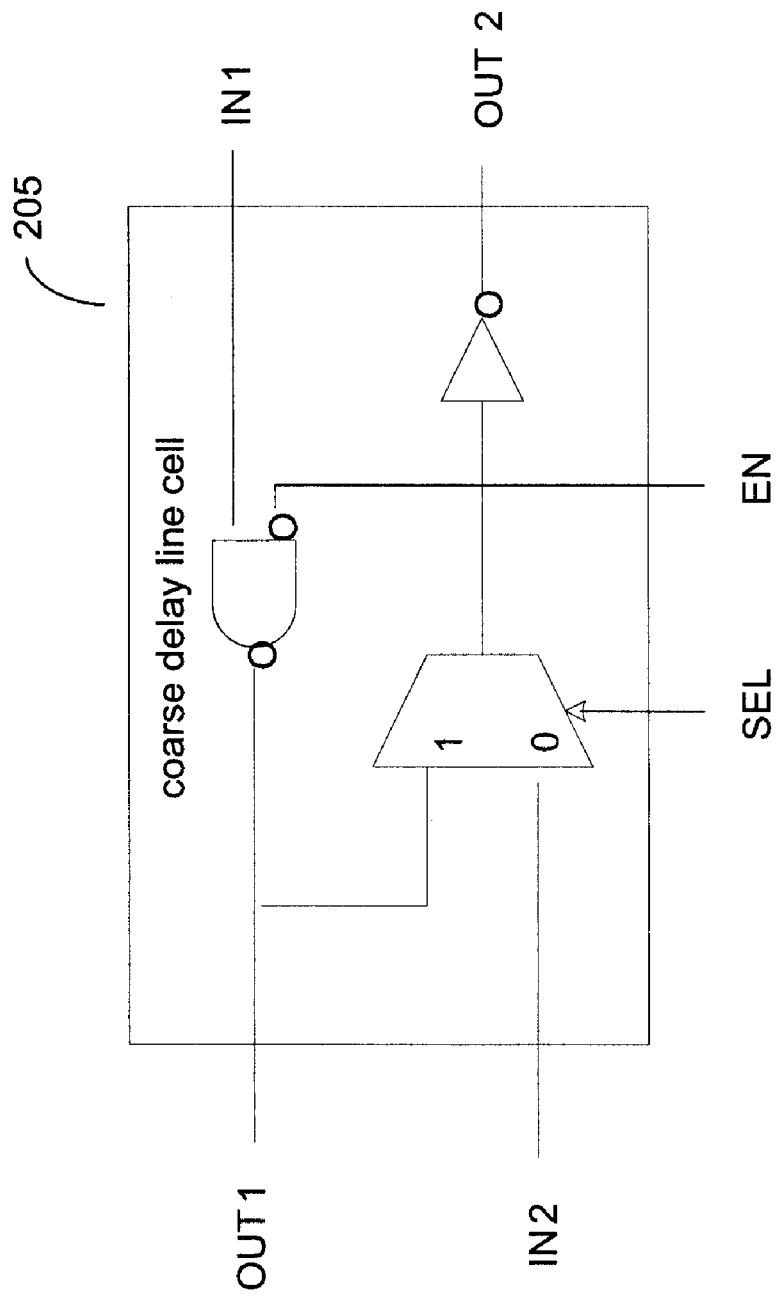
FIG. 2 is a schematic representation of an exemplary coarse delay line cell in accordance with an embodiment of the invention.

FIG. 2 is a schematic representation of an exemplary coarse delay line cell 205 in accordance with an embodiment of the invention.

The coarse delay line cell 205 is used to create a precise unit delay. The input, IN1, is delayed by a precise amount by the upper NAND gate and is then provided on the upper output, Out1. The output of the upper NAND gate may be selected by the lower multiplexer, under control of the select input, SEL. The output of the multiplexer is inverted and provided to the lower output signal, OUT2. In an embodiment of the invention, the lower input on the multiplexer may select a different input, IN2. This input may come from an adjacent cell. This allow delays to be cascaded to create larger delays that are integer multiples of the unit delay composed of the delay through the NAND gate, the delay through the multiplexer and the delay through the inverter. The clock gating capability can stop the clock propagation further in the coarse delay line cells. A complete digital delay line may be created by replicating and abutting an arbitrary number of cells.

The coarse delay line cell 205 described above may include a greater or a fewer number of elements than those included in FIG. 2.

Figure 3:
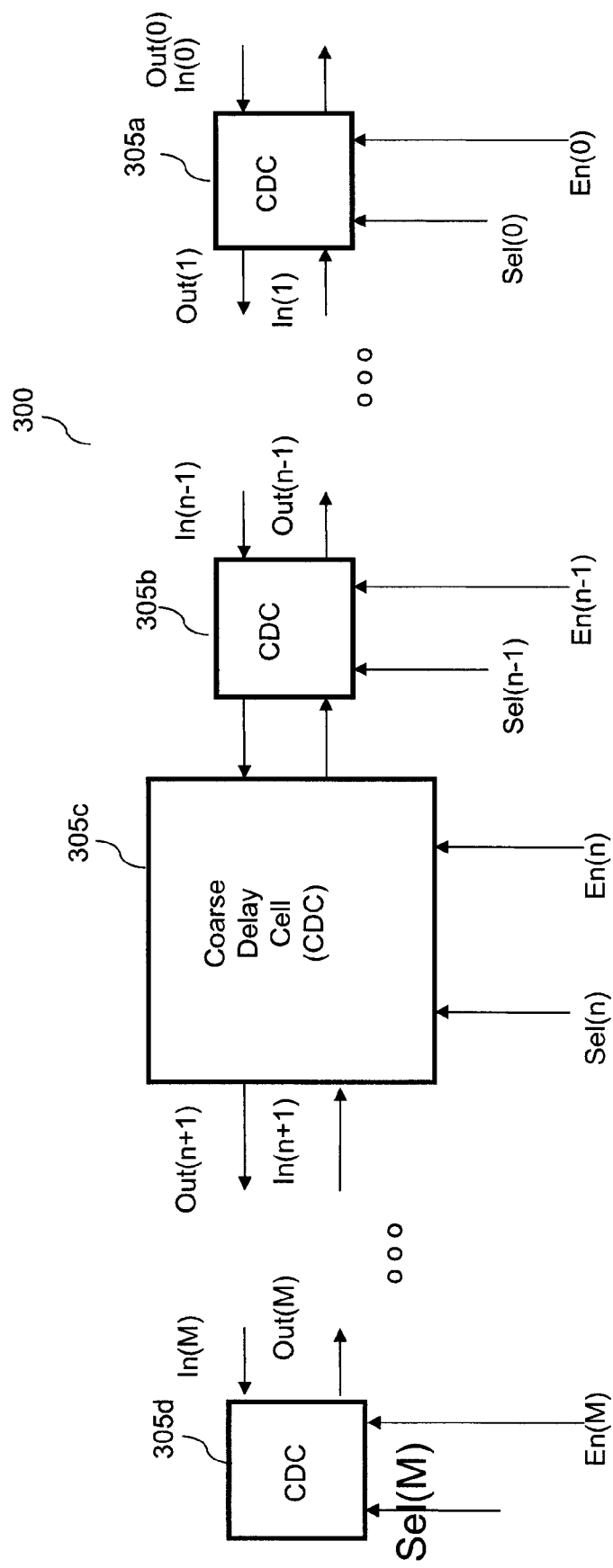
FIG. 3 is a schematic representation of an exemplary coarse delay line structure in accordance with an embodiment of the invention.

FIG. 3 is a schematic representation of an exemplary coarse delay line structure 300 in accordance with an embodiment of the invention.

The coarse delay line structure 300 shows the structure and interconnects of an arbitrary number (M) of coarse delay line cells 305 to create the complete coarse delay line, the coarse delay cells 305*a*, 305*b*, 305*c* and 305*d* being the examples. The input to the coarse delay line, In(0), is on the far right. If the enable signal, En(0) is a logic low, the signal is propagated to Out(1). If the select signal, Sel(0), is a logic high, the Out(1) signal is propagated to the Coarse Delay Line output, Out(0), and the resulting delay from input to output is a single unit delay. If the select signal, Sel(0), is a logic low, the In(1) signal is selected as the source and is propagated to the Coarse Delay Line output, Out(0). The resulting delay will be 1 unit delay plus whatever delay exists to the left of the first coarse delay cell. If n coarse delay cells are selected, then the overall delay will be n times the unit delay.

In an embodiment of the invention, enable signals may be used to turn-off gates in coarse delay cells that are not used as delay elements. This helps reduce power consumed by the coarse delay line and may be a significant savings in power constrained designs.

Some embodiments of the invention use the fact that the architecture of the coarse delay line is very regular and simple. The interconnect signals between cells all align and there is a minimum of wasted space. This results in a very efficient layout and reduces die size and thus cost. This is an important consideration in cost constrained designs.

Additionally, if the delay needs to be changed by a single unit delay, the most common situation during timing adjustment, that the only signals that need to change are the select and enable signals at the left side boundary between the enabled coarse delay cells. The n+1 select and enable will be "turned on" to add a unit delay, or the n select and enable will be "turned off" to reduce the unit delay by one. This is a very efficient method for making updates and reduces the logic and interconnect required, saving both power and die size-both important considerations in many designs.

The coarse delay line structure 300 described above may include a greater or a fewer number of elements than those included in FIG. 3.

Figure 4:
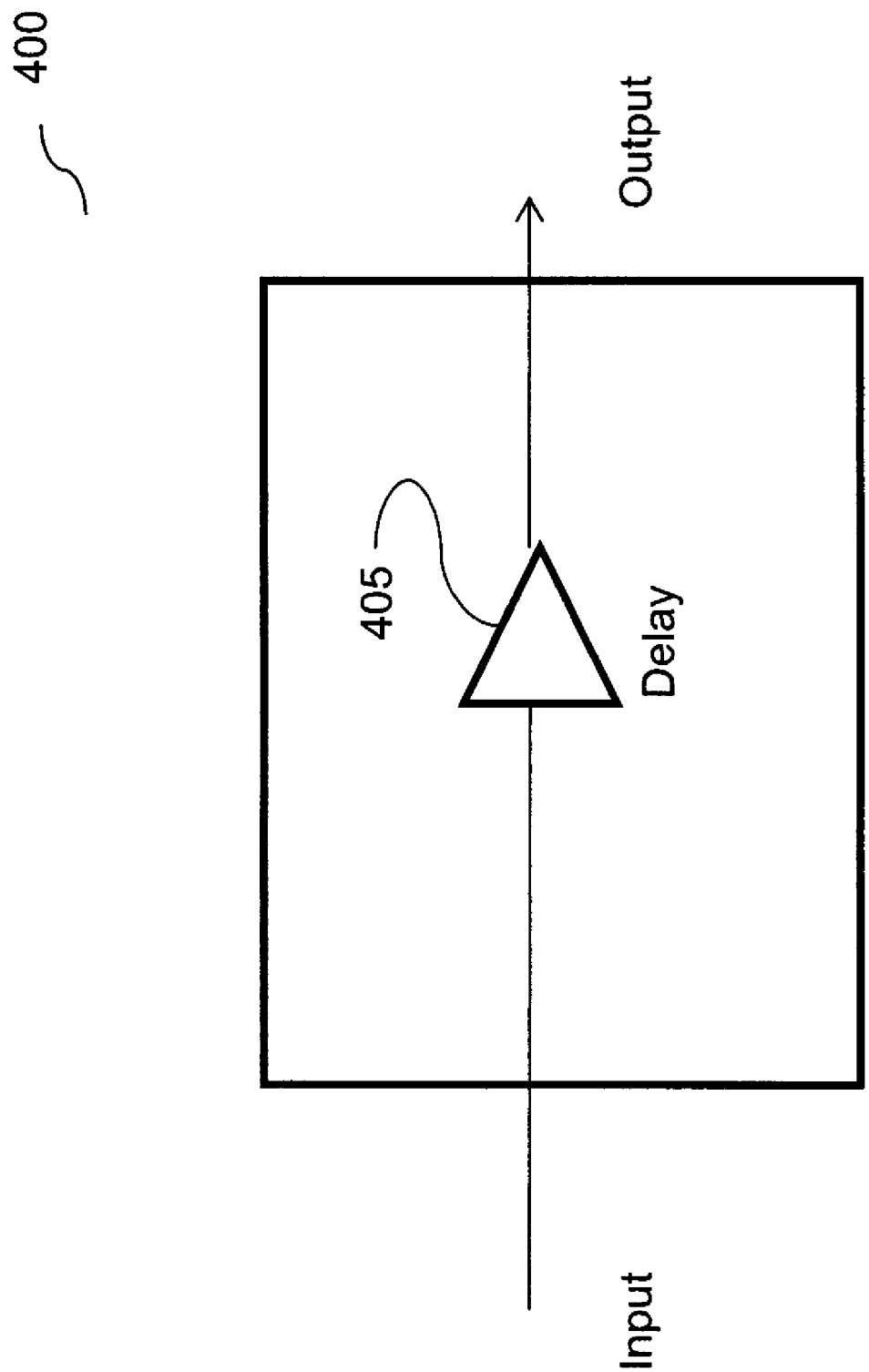
FIG. 4 is a schematic representation of an exemplary finite delay line cell in accordance with an embodiment of the invention.

FIG. 4 is a schematic representation of an exemplary fine delay line cell 400 in accordance with an embodiment of the invention.

The input signal is connected to a single buffer 405 with a specific delay. The output of the buffer is connected to the cell output. The delay is set to be a fraction of the coarse delay line cell delay. This allows for more precise timing relationships than are possible if just using the coarse delay line cell. For example, fine delay line cell 400 may be set in increments of 20% of the coarse delay line cell delay. By using 4 fine delay line cells, with 20%, 40%, 60% and 80% delay values it is possible to cover any delay between coarse delay cell delays with a 20% increment. In an embodiment of the invention, other combinations of delays are possible and are implemented.

The fine delay line cell 400 described above may include a greater or a fewer number of elements than those included in FIG. 4.

Figure 5:
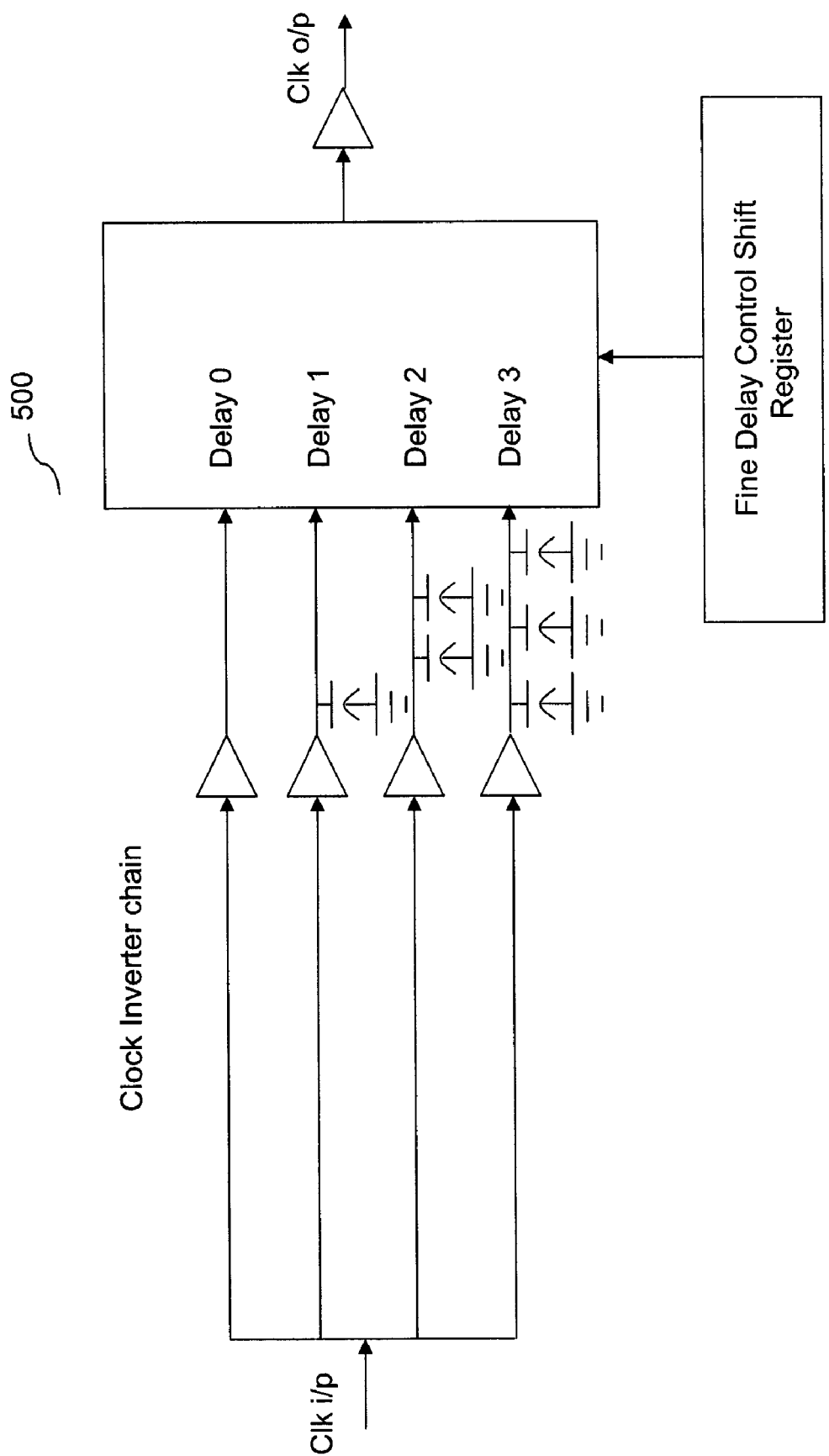
FIG. 5 is a schematic representation of an exemplary finite delay line structure in accordance with an embodiment of the invention.

FIG. 5 is a schematic representation of an exemplary fine delay line structure 500 in accordance with an embodiment of the invention.

In an embodiment of the invention, there are four different fine delay cells each with a different delay value, Delay0 thru Delay3. The select signals Select (0) thru Select (3) select which delay will be applied to the input signal, Clk In. The output, Clk Out, is the logic OR of the delayed signals, but since only one is selected at a time it is thus delayed by the selected amount-Delay0, Delay1, Delay2 or Delay3.

There are 4 selections possible

Delay 0=minimum delay

Delay 1=Delay 0+1 "tap" delay, where 1 tap is equal one quarter of the delay of the course delay line Delay 2=Delay 0+2 tap delays Delay 3=Delay 0+3 tap delays These elements of the fine delay line allow interpolation between any two course delay line settings in increments of ¼ of a coarse delay.

In one embodiment, the tap size is made as consistent as possible, For example, the difference between delay0 and delay1 is equal to the difference between delay1 and delay2 and also equal to the difference between delay2 and delay3. It is also important that the difference between two adjacent delays be equal to a quarter of the course delay element.

The delay in one embodiment is achieved by varying the loading on each line. In another embodiment, any combination of varying the loading and instantiating additional buffers can be used to achieve the desired delay characteristics.

The example in FIG. 5 includes but is not limited to four fine delay settings. This architecture is extensible to any arbitrary number of fine delay line settings.

Figure 6:
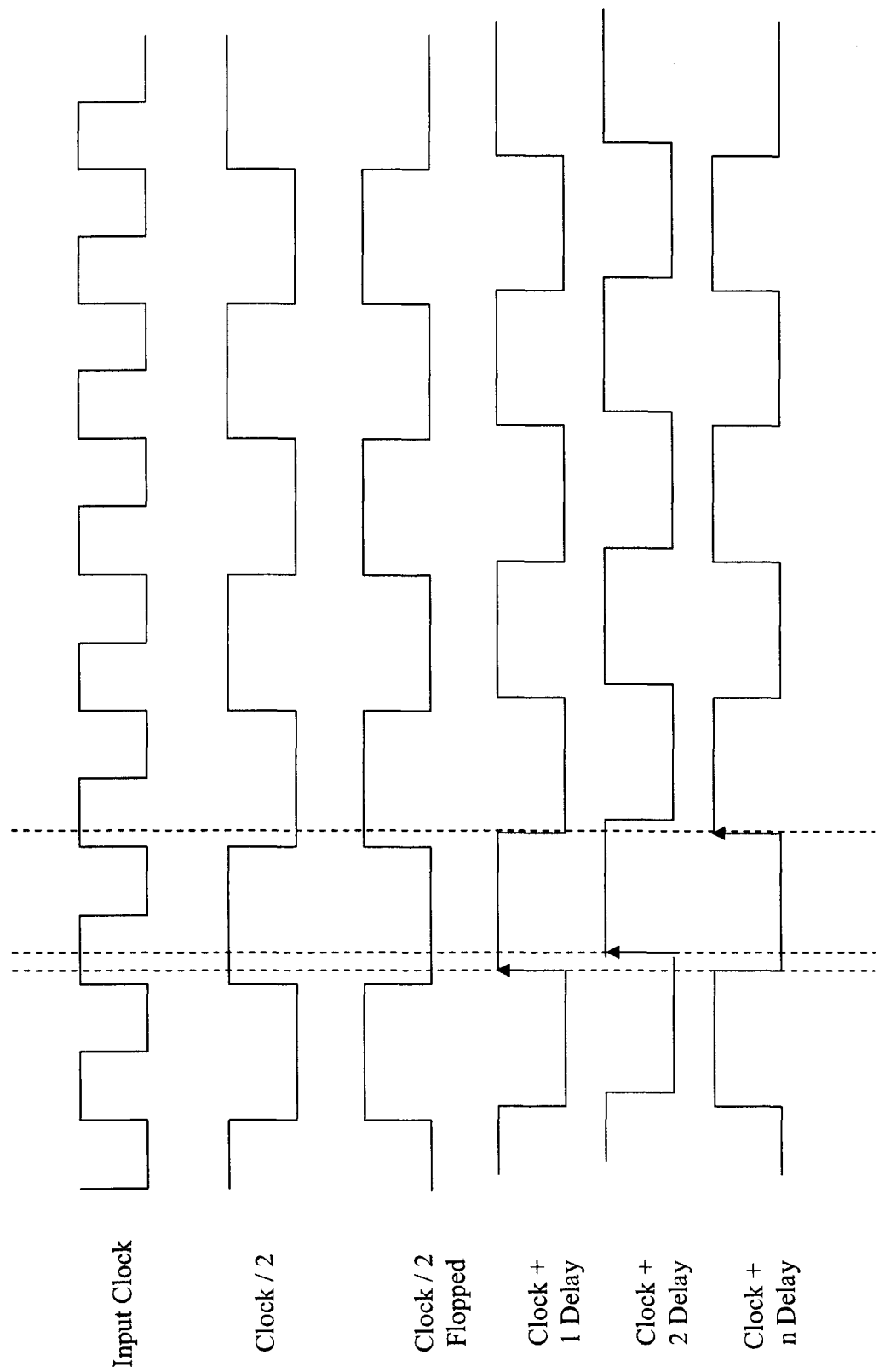
FIG. 6 is a timing diagram of clock signals.

FIG. 6 is a timing diagram of the clock signals in the digital delay locked loop. A clock signal is divided by two (clock/2 signal) and is sent as input to the coarse and fine delay lines. The clock/2 flopped signal is sent as input to the phase detector. This signal is sampled at small precise intervals. This sampling is continued at the same value for a full clock cycle. To detect a full cycle shift, only one transition must be detected. A full cycle shift is detected when the rising edge of the shifted clock samples a one on the clock/2 signal.

Figure 7:
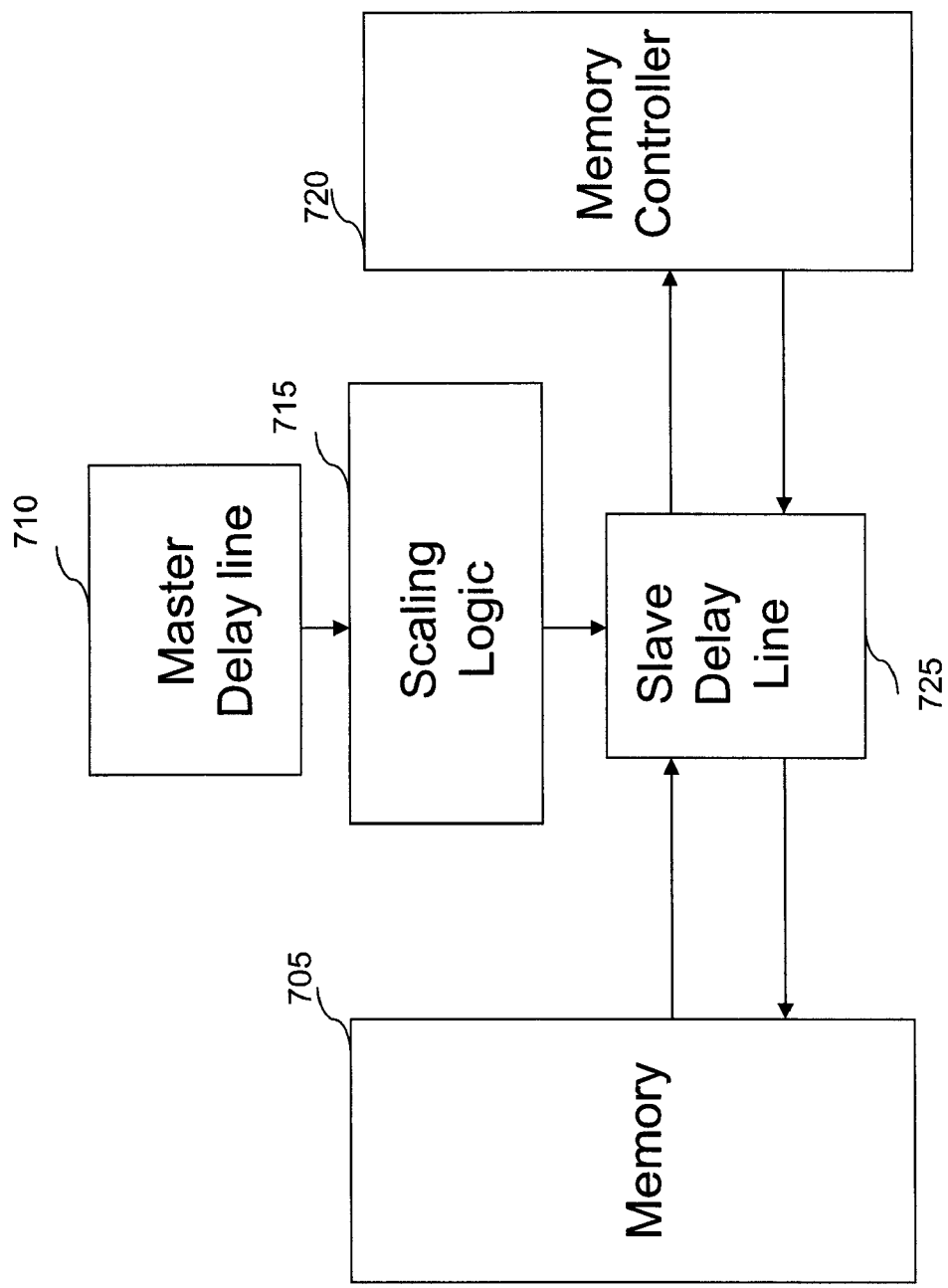
FIG. 7 is a block diagram of a double data rate DDR memory system.

FIG. 7 is an example of a DDR memory system which includes a DDR memory 705 examples including but not limited to a DRAM device, a master delay line 710, scaling logic 715, slave delay line 725, and a memory controller 720. The delay functions in a master/slave architecture. The master delay line 710 is responsible for measuring the number of taps required to perform a 1-cycle shift. A "tap" is the minimum delay increment of the delay line. Since the time delay of a tap varies with process, voltage, and temperature, the master delay line 710 is required to measure the number of taps that are needed to form a full-cycle shift under specific conditions.

The number of taps required for making a 1/n-cycle shift can be determined by taking the output value of the master delay line 710 and dividing it by n. The slave delay line 725 is a delay line that delays a signal by a number of taps, where the number of taps is computed along with of a scaling logic 715.

A clock is used to synchronously transfer commands to the DRAM devices. Data is transferred to the DRAM devices 705 in case of a write signal and from the DRAM devices in case of a read signal. For both read signals, the DRAM device(s) output a strobe signal DQS and data DQ with every edge of that strobe signal. During read operations, the DQ (data) and DQS (strobe) are sent from the DRAM device 705 to the memory controller 720. The DQ and DQS from DRAM transition at the same time, but the DQS must be used to latch the DQ. To facilitate the latching of DQ data, the memory controller 720 must shift the DQS signal before it can be used to latch stable data signals. Similarly for write signals, the controller outputs a DQS and DQ to the DRAM device(s). The memory controller 720 must send a DQS (strobe) that is centre aligned on the DQ (data) that is sent to DRAM device 705. In order to achieve this, the DQS must be shifted relative to the DQ transitions. Often DQS and DQ are bi-directional tristated signals. The DQS signal is used as a clock input to flops at the receiver (DRAM in the case of write signals and memory controller in the case of read signals) which captures DQ on the D input to the flop. One DQS signal is typically used to latch 4 or 8 DQ signals.

The use of the combination of the fine delay cell and the coarse delay cell results in smaller power dissipation, smaller die size, reduced jitter, higher performance and eases transfer from process to process without additional characterization or prototype work.

The foregoing description sets forth numerous specific details to convey a thorough understanding of embodiments of the invention. However, it will be apparent to one skilled in the art that embodiments of the invention may be practiced without these specific details. Some well-known features are not described in detail in order to avoid obscuring the invention. Other variations and embodiments are possible in light of above teachings, and it is thus intended that the scope of invention not be limited by this Detailed Description, but only by the Claims.

We claim:

1. A delay locked loop (DLL) circuit, the DLL circuit comprising:
   a clock divider circuit that provides a reference clock signal;
   a phase detector circuit that receives the reference clock signal and a delay line output signal and provides an error signal;
   a delay control finite state machine that receives the error signal and provides coarse and fine control signals and C-locked and F-locked signals;
   a delay circuit including a coarse delay line that receives the coarse control signal and a fine delay line that receives the fine control signal and a signal from the coarse delay line and provides the delay line output signal; and
   a low pass filter that receives the coarse and fine control signals and the C-locked and F-locked signals and provides an output measurement that filters out instantaneous fluctuations in one or more of these signals.

2. The DLL circuit of claim 1, wherein the coarse delay line comprises a plurality of coarse delay line cells, wherein the coarse delay line cells further comprise a combination of gates.

3. The DLL circuit of claim 1, wherein the fine delay line comprises a plurality of fine delay cells, wherein the fine delay line cells further comprise a combination of gates.

4. The DLL circuit of claim 1, wherein the delay control finite state machine comprises: a coarse shift register holding bits for determining a coarse delay of the coarse delay line; and a fine shift register holding bits for determining a fine delay of the fine delay line.

5. The DLL circuit of claim 4, wherein the delay control finite state machine further generates control signals for adjusting the fine delay line output and the coarse delay line output.

6. The DLL circuit of claim 1, wherein the output low pass filter minimizes jitter by adjusting the C-locked and F-locked signals.

7. A delay locked loop (DLL) circuit, the DLL circuit comprising:
- a means for generating a reference clock;
- a means for receiving the reference clock signal and a delay line output signal and for generating an error signal;
- a means for receiving the error signal and for generating coarse and fine control signals and C-locked and F-locked signals;
- a means for receiving the control signals and for generating the delay line output signals; and
- a means for receiving the coarse and fine control signals and the C-locked and F-locked signals and for providing an output measurement that filters out instantaneous fluctuations in one or more of these signals.

8. A method for generating a delay in a delay locked loop (DLL) circuit, the method comprising:
- generating a reference clock;
- receiving the reference clock signal and a delay line output signal for generating an error signal;
- receiving the error signal for generating coarse and fine control signals and C-locked and F-locked signals;
- receiving the control signals for generating the delay line output signals; and
- receiving the coarse and fine control signals and the C-locked and F-locked signals and for providing an output measurement that filters out instantaneous fluctuations in one or more of these signals.

9. The method of claim 8, wherein the generating the error signal comprises comparing the reference clock and the delay line output signal by a phase detector.

10. The method of claim 8, wherein the generating coarse and fine control signals is achieved by a plurality of control bits generated by a delay control FSM.

11. A double data rate (DDR) memory system, the double data rate memory system comprising:
- a double data rate memory that allows data transfer on both edges of a reference clock cycle;
- a delay locked loop that provides a delayed clock signal, wherein the delay locked loop comprises:
  - a clock divider circuit that provides a reference clock signal;
  - a phase detector circuit that receives the reference clock signal and a delay line output signal and provides an error signal;
  - a delay control finite state machine that receives the error signal and provides coarse and fine control signals and C-locked and F-locked signals;
  - a delay circuit including a coarse delay line that receives the coarse control signal and a fine delay line that receives the fine control signal and a signal from the coarse delay line and provides the delay line output signal; and
  - a low pass filter that receives the coarse and fine control signals and the C-locked and F-locked signals and provides an output measurement that filters out instantaneous fluctuations in one or more of these signals; and
- a memory controller that sends memory control signals for efficient access of the double data rate memory.

12. The DDR memory system of claim 11, wherein the coarse delay line comprises a plurality of coarse delay line cells, wherein the coarse delay line cells further comprise a combination of gates.

13. The DDR memory system of claim 11, wherein the fine delay line comprises a plurality of fine delay cells, wherein the fine delay line cells further comprise a buffer with a delay.

14. The DDR memory system of claim 11, wherein the delay control finite state machine comprises:
- a coarse shift register holding bits for determining a coarse delay of the coarse delay line; and
- a fine shift register holding bits for determining a fine delay of the fine delay line.

15. The DDR memory system of claim 11, wherein the delay control finite state machine further generates control signals for adjusting the fine delay line output and the coarse delay line output.

16. The DDR memory system of claim 11, wherein the output low pass filter minimizes jitter by adjusting the clock output.

17. A double data rate (DDR) memory system, the double data rate (DDR) memory system comprising:
- a means for storing and transferring data at a high speed;
- a means for generating a delay wherein the means for the generating comprises:
  - a means for generating a reference clock;
  - a means for receiving the reference clock signal and a delay line output signal and for generating an error signal;
  - a means for receiving the error signal and for generating coarse and fine control signals and C-locked and F-locked signals;
  - a means for receiving the control signals and for generating the delay line output signals; and
  - a means for receiving the coarse and fine control signals and the C-locked and F-locked signals and for providing an output measurement that filters out instantaneous fluctuations in one or more of these signals; and
- a means for synchronizing and controlling the data with respect to the delay.

18. A method for precise control of timing of the interface signals between a DDR memory and a DLL, the method comprising:
- generating a reference clock;
- receiving the reference clock signal and a delay line output signal for generating an error signal;
- receiving the error signal for generating coarse and fine control signals and C-locked and F-locked signals;
- receiving the control signals for generating the delay line output signals;
- receiving the coarse and fine control signals and the C-locked and F-locked signals and for providing an output measurement that filters out instantaneous fluctuations in one or more of these signals;
- receiving data on both edges of the reference clock; and
- synchronizing and controlling data with respect to the delayed clock signal.

* * * * *